March 28, 1961 N. I. KORMAN 2,977,588

RADAR SYSTEMS WITH GAIN EQUALIZATION CIRCUITS

Filed March 31, 1949 3 Sheets-Sheet 1

INVENTOR
NATHANIEL I. KORMAN
BY J. L. Whittaker
ATTORNEY

March 28, 1961 N. I. KORMAN 2,977,588

RADAR SYSTEMS WITH GAIN EQUALIZATION CIRCUITS

Filed March 31, 1949 3 Sheets-Sheet 2

INVENTOR
NATHANIEL I. KORMAN
BY J. L. Whittaker
ATTORNEY

INVENTOR
NATHANIEL I. KORMAN
BY J. L. Whittaker
ATTORNEY

United States Patent Office 2,977,588
Patented Mar. 28, 1961

2,977,588

RADAR SYSTEMS WITH GAIN EQUALIZATION CIRCUITS

Nathaniel I. Korman, Merchantville, N.J., assignor to Radio Corporation of America, a corporation of Delaware Filed Mar. 31, 1949, Ser. No. 84,628

22 Claims. (Cl. 343—16)

This invention relates generally to gain equalization circuits and more particularly to such circuits in which the gains in a plurality of amplifier circuits are maintained identical with each other and without disturbing their functioning for their intended purposes. The invention also relates to an improved radar system for obtaining directional information, said system preferably employing a gain equalization circuit.

In many radio arrangements, it is desired to observe and compare the outputs of a single source of radio energy fed through a plurality of circuits in which different alterations of the characteristics of the current, such as phase shifting, are imposed on the outputs of the source in the plurality of circuits. When such plurality of output currents are amplified and the amplitudes are compared for intelligence signals, errors will result unless the gains in the amplifiers in the individual circuits are identical. To rely on the observations of an amplitude comparison of the outputs of the circuits, the amplifiers must be maintained to equal gain and without disturbing the circuits in their functioning for their intended purposes.

The principal object of the invention is to provide a method of and apparatus for maintaining equal the gain in individual amplifiers in a plurality of circuits connected to a source of radio energy.

Another object of the invention is to provide a method of and apparatus for adjusting the gain of an amplifier in accordance with the difference in gain between the said amplifier and a second amplifier connected in a parallel amplifier circuit, the source of the energy flowing through the two amplifiers being common to both amplifiers.

Another object of the invention is to provide a method of and apparatus for determining and maintaining equal the gain in a plurality of amplifiers connected to a pulsed signal energy source by connecting the amplifiers to a second common source of energy that is pulsed between the pulses of the signal energy source and utilizing the difference in gains between the two amplifiers, if any, to equalize the gains and make the gains in two amplifiers identical.

Another object of the invention is to provide a method of and apparatus for securing directional radar intelligence from a pair of receiving antennas that are displaced in axial parallel relation to each other.

Gain equalizer circuits of the specified type have been found to be particularly useful in connection with microwave devices used to obtain range, elevation and azimuth intelligence concerning remote target objects, in which two receiving antennas are positioned in adjacent axial parallel relation to each other to obtain either elevation or azimuth intelligence and in which the pulse modulated radio frequency echoes received by the separate antennas are fed into separate amplifying circuits. In devices of this type the accuracy of the elevation or azimuth intelligence is in a large part dependent upon the separate amplifiers maintaining equal gain characteristics so that the signals received from the separate amplifiers by the associated amplitude comparison circuit are precisely representative of the character of signals as initially received by the separate antennas. The remaining condition necessary for precise elevation and azimuth information in this type of device is the maintenance of constant electrical characteristics of the phasing section of the antennas and the receiver feed lines from the antennas. This, however, can be satisfactorily accomplished by utilizing short rigid lengths of coaxial conductor or of waveguide. A method of and means for automatically maintaining equal the gain of the separate amplifiers of a device of this type, and thereby eliminating the source of error resulting from different gain characteristics of the separate amplifiers, is hereinafter described.

The invention will be described in its application to the obtaining directional intellgence in a vertical plane, that is, to determine when the axes of the two receiving antennas are elevated, in the plane of the azimuth bearing of the target, to an angle equal to the true elevation of the target. In this case, the two antennas are mounted one above the other in the same vertical plane. It is obvious that the invention may be applied to the obtaining of azimuth directional intelligence by mounting the antenna spaced apart in axis parallel relation in the same horizontal plane.

Figures 3, 4:
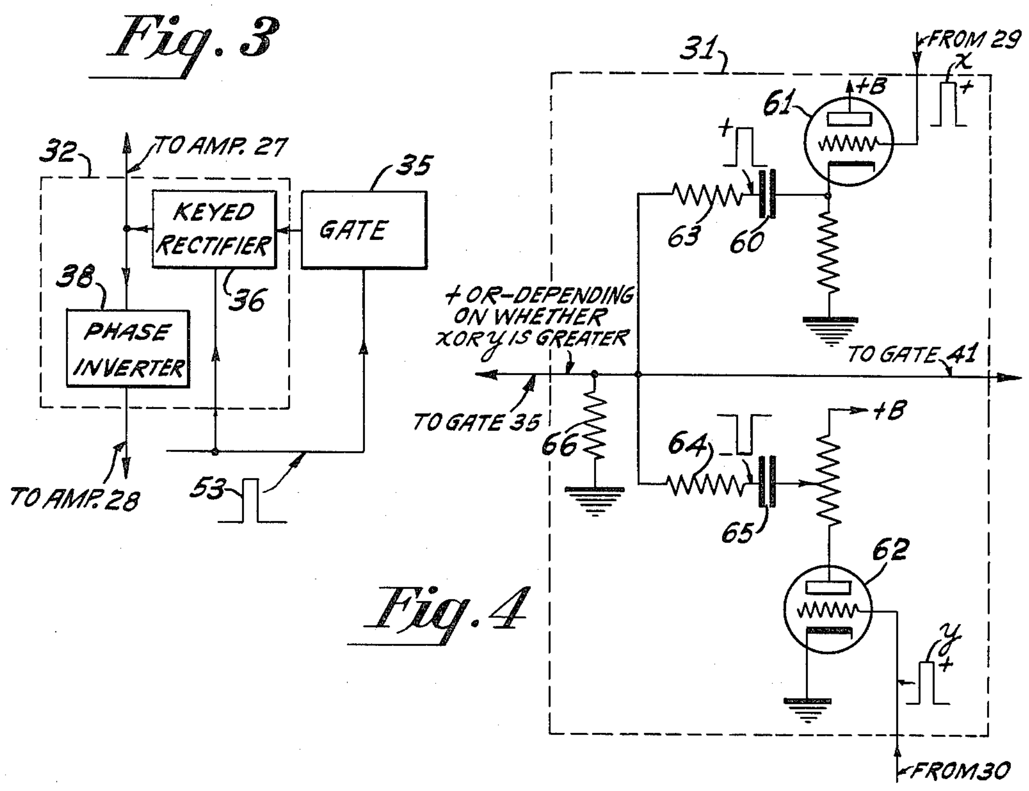
Figure 5:
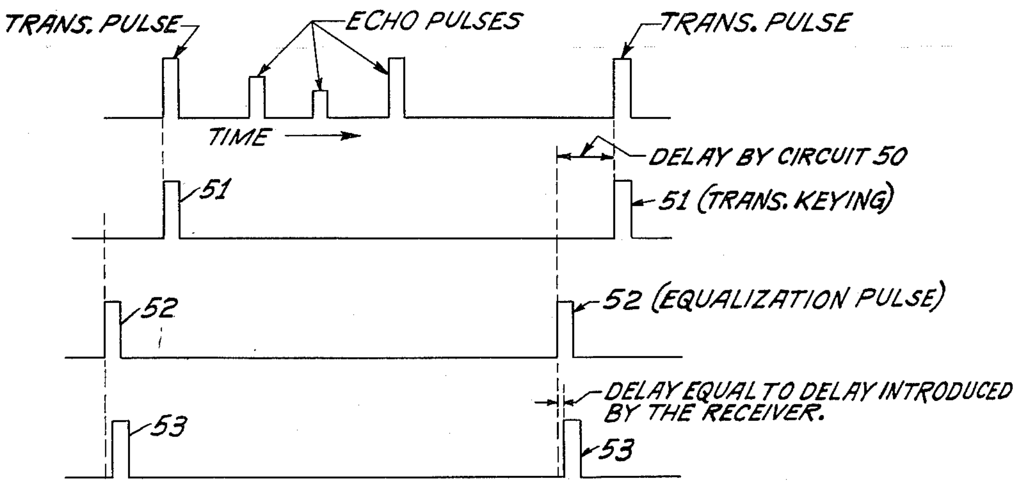
Figure 6:
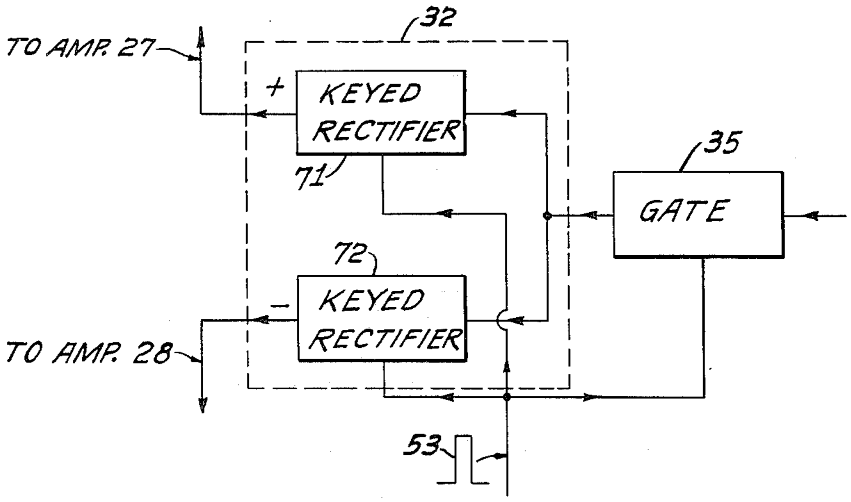

Figure 3 diagrammatically illustrates a type of gain equalization circuit which may be employed in practicing the invention;

Figure 4 diagrammatically illustrates a type of amplitude comparison circuit which may be employed in practicing the invention;

Figure 5 is a time diagram showing the sequence of operations of the several component elements associated with the automatic gain equalizing device, and Figure 6 diagrammatically illustrates another type of gain equalization circuit which may be employed in practicing the invention.

In the several figures similar parts are indicated by similar reference characters.

In the device illustrated, 20 indicates a transmitter and antenna element of a pulse modulated radio frequency generator. A receiver antenna array is comprised of the separate antennas 21 and 22 which are positioned one above the other so that the lobe patterns of the antennas intersect at approximately the half-power point of each of the lobe patterns. The vertical displacement of the antennas may be varied to the extent of positioning the crossover point of the lobe patterns at approximately between the 50% and 85% maximum signal point. The antennas 21 and 22 are tied together so that they turn as a unit when being directed toward a target. This tie-in preferably is by a mechanical connection.

With this arrangement, when the two antennas are pointed as a unit directly toward the target, i.e., are "on" target, the distance from one antenna to the target is the same as the distance from the other antenna to the target. On the other hand, due to the spacing between antennas, when the antennas are "off" the target the said two distances are not equal whereby, due to the difference in travel time of the echo, there is a phase difference between the echo signals picked up by the two antennas.

Antennas 21 and 22 are connected directly to two crystal mixers 25 and 26, respectively, by separate feed lines. In these feed lines are placed individual 90° phase shifters 23 and 24, the output of phase shifter 23 being connected to crystal mixer 26 and the output of phase shifter 24 being connected to crystal mixer 25. There is thus delivered to crystal mixer 25 radio energy from the echo of the transmitted pulse directly from antenna 21 and from antenna 22 through phase shifter 24. Likewise, there is delivered to crystal mixer 26 radio energy directly from antenna 22 and from antenna 21 through phase shifter 23.

There is also connected to mixers 25 and 26 the output of local oscillator 43 which is combined with the currents from antennas 21 and 22 to produce IF currents that are amplified in the IF amplifiers 27 and 28, respectively. After detection in the second detectors 27*a* and 28*a*, the signals are amplified in the video amplifiers 29 and 30, respectively. The outputs of amplifiers 29 and 30 are compared in the amplitude comparison circuit 31 designated in this application and appended claims as an "amplitude comparator" or a "comparator." The output of comparator 31 is transmitted to visual indicator 42 through gate 41, which output is a measure of the error in pointing the axes of the antennas 21 and 22 toward the target, as will be more fully explained hereinafter.

The connections in the phasing section of the antenna array are comprised of short rigid lengths of coaxial conductor or wave guide in order to maintain constant the electrical characteristics in this portion of the receiver circuits.

The gains in the two amplifier channels 27, 29 and 28, 30 are equalized by passing through the two channels, between the pulses received from antennas 21 and 22, pulsed currents from a single local source and applying any difference in outputs of the amplitude of the amplifiers to a gain equalization circuit, the output of which is applied to the grids of the individual amplifiers. This is accomplished by providing a local oscillator 34, the frequency of which is approximately that of the transmitter 20. The oscillator 34 is pulsed by pulses 52 (see Figure 5) supplied from a pulser 33 so that the output of oscillator 34 is mixed with the output of oscillator 43 between the times of pulses of transmitter 20 and times of pulses received by antennas 21 and 22. If there is any difference in the gains of the two amplifier channels, the difference is resolved by the comparator 31. The resultant output of comparator 31 is fed into the gain equalization circuit 32. Comparator 31 is connected to gain equalization circuit 32 through gate 35 which is opened up by pulses 53 (see Figure 5) from pulser 33. The pulses 53 are delayed slightly with respect to the pulses 52 by suitable means such as a delay line DL1. This delay is just sufficient to compensate for the amount of delay introduced by the receiver so that the gate 35 is opened at the time the pulsed output caused by pulses 52 appears at the gate 35.

It is thus seen that comparator 31 is gate-connected to visual indicator 42 when antennas 21 and 22 are supplying current to mixers 25 and 26, and is gate-connected to gain equalization circuit 32 only when oscillator 34 is supplying current to mixers 25 and 26. Since the equalization pulse 52 always appears later than the last possible echo pulse (see Figure 5) an echo pulse will never get into the equalization circuit.

A keyed rectifier in the equalization circuit 32 is also keyed by the pulses 53 as will be described in connection with Figure 3. The time relation of the several pulses will be apparent from Figure 5.

It will be seen that the transmitter 20 is keyed or modulated by pulses 51 from the pulser 33 after they have been delayed by suitable means such as a delay circuit 50. As is evident from an inspection of Figure 5, this results in the equalization pulses 52 occurring just ahead of the transmitted pulse and after the last echo.

Figure 1:
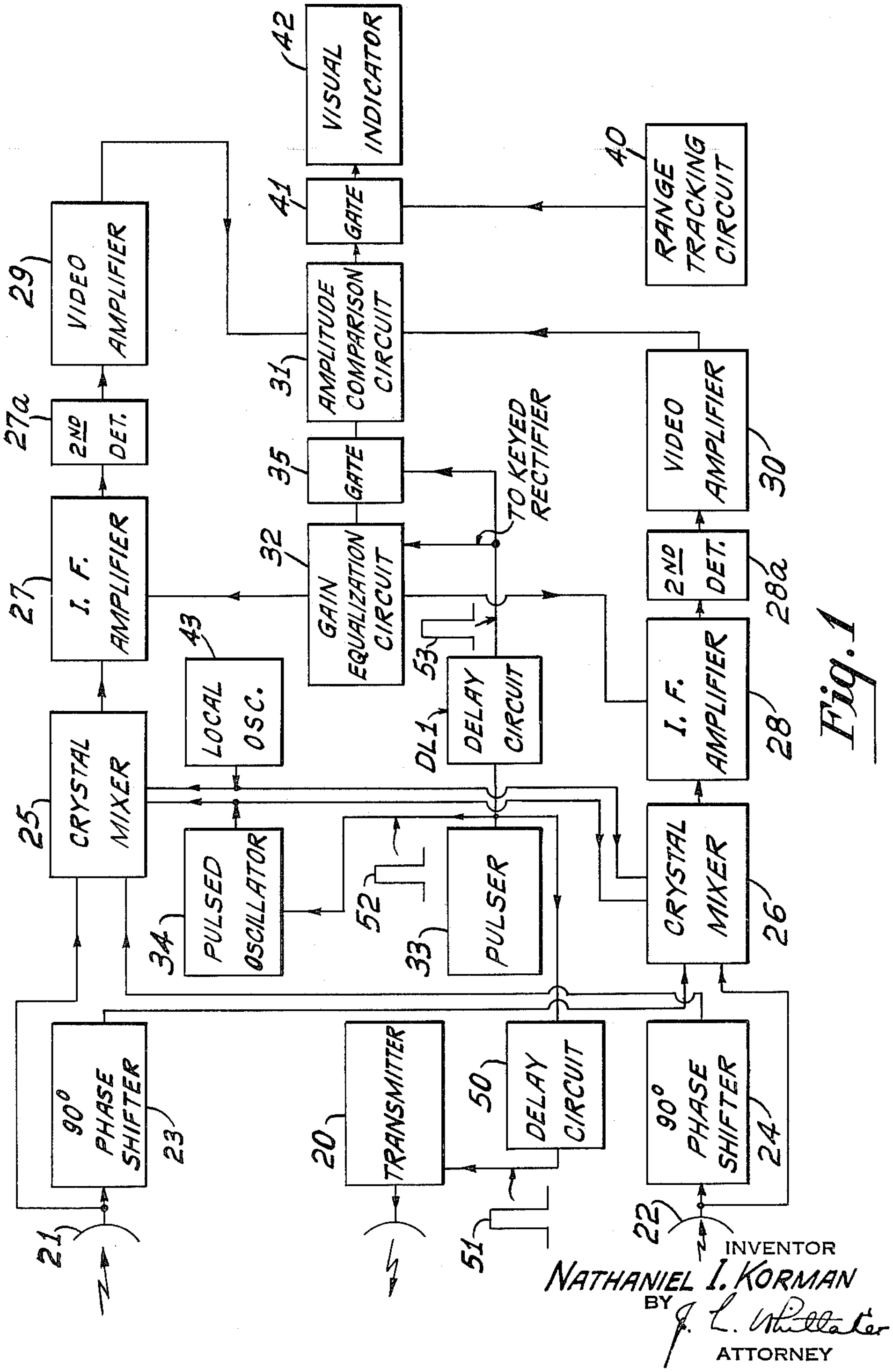
Figure 1 is a block diagram of a pulse modulated radio-frequency ranging device and illustrates diagrammatically the application of automatic gain equalization to the circuits of the device.
Figure 2:
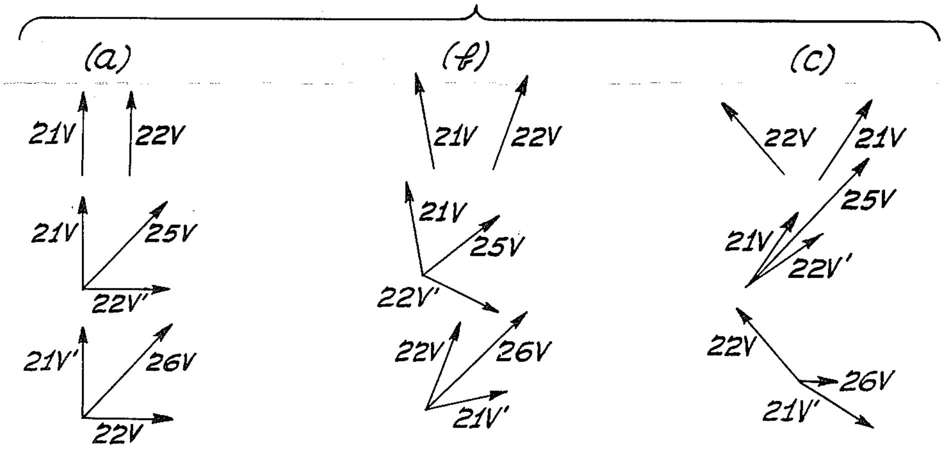
Figure 2 is a series of diagrams illustrating the phase addition of the echo signals received by the separate antennas as they are received by the crystal mixers of the device under conditions when the target is positioned in the axis of the antenna array, and above and below the said axis.

With reference to Figure 2, the signals received by the antennas 21 and 22 are represented by the vectors designated 21V and 22V, respectively, the characters 21V′ and 22V′ indicating the signals fed to the amplifying circuits of the respective antennas through the 90° phase shifter associated with the opposite antenna.

It will be noted that when the axis of the antenna array is pointed directly at the target, the signals delivered to the separate crystal mixers 25 and 26 will be equal in phase and amplitude, as indicated by the resulting vectors 25V and 26V of Figure 2(*a*) which illustrates the phase addition of the received signals in this condition of pointing of the axis of the antennas to the target. It will be understood that the phase relation referred to is that of the carrier wave signal. The magnitude of the input into the separate crystal mixers 25 and 26 when the target object is displaced either above or below the axis of the antenna array is illustrated by the respective magnitudes of the vectors 25V and 26V of Figures 2(*b*) and (*c*). The degree of error with which the antenna array is being pointed at the target is indicated by the magnitude of the difference between the inputs to the crystal mixers 25 and 26, and this difference after amplification in the intermediate frequency amplifiers, indicated diagrammatically at 27 and 28, and in the video amplifiers 29 and 30 is resolved in the comparator 31 from which intelligence is derived which enables the operator of the device to adjust the pointing direction of the antenna array so that the magnitude of the signal inputs to the separate crystal mixers are equal.

The accuracy with which the pointing error is indicated is dependent upon the signals delivered to the comparator 31 having the same relative amplitude as the signals received initially by the separate antennas. It will be apparent, therefore, that the separate amplifier circuits must be maintained with identical gain characteristics, and the identical characteristics of the amplifier circuits must be established immediately prior to the reception of each individual pulse reflected to the receiver by the target.

The gains of the separate amplifiers are equalized by providing a gated gain equalization circuit 32 which functions to change the grid bias of the individual amplifiers 27 and 28 to the extent necessary to balance the gains when the pulser 33 gates the gain equalization circuit 32 and simultaneously (except for delay compensation introduced by DL1) pulses an oscillator 34 which feeds a radio frequency signal through the separate amplifiers preceding the pulsing of the transmitter 20.

Following the equalization operation, the bias of the grid of the gate 35 is returned to a point well beyond the cut-off and the gain equalization circuit is eliminated prior to the reception of the echo signal in the receiver.

The pulsed oscillator 34 may be a radio frequency generator of any known type but in the preferable form it may consist of a magnetron which is externally pulsed by the pulser 33. The output of the pulsed oscillator is preferably of the carrier frequency of the transmitter so that the preparatory gain equalization operation will be conducted with signals having characteristics similar to those reflected from the target.

The output of the pulsed oscillator 34 may be coupled to the crystal mixers in any well known manner, for example, the coupling may be accomplished by means of a probe in the mixer cavity of the crystals mixers 25 and 26. The difference frequency component of the crystal mixers 25 and 26 is fed to the separate intermediate frequency amplifiers 27 and 28. The output of the gain equalization circuit 32 may be applied to the grids of the IF amplifiers to effect the gain equalization of the amplifiers. It should be understood that the gain equalization output from circuit 32 may be applied in various ways to control gain and may be applied either to the IF amplifiers or to the video amplifiers or to both.

The outputs of the separate amplifier channels are received by the comparator 31 which resolves the signals for visual presentation of the desired intelligence at indicator 42. The output of the comparator is also fed to the gated gain equalization circuit 32.

The gain equalization circuit 32 illustrated in Figure 3 comprises a keyed rectifier 36 which receives the output of the comparator 31 by way of the gate 35 and which is keyed by pulses 53. The keyed rectifier 36 is also known as a clamping circuit or a direct current inserter. Such circuits are well known in the art. For example see Patent No. 2,298,809, issued October 13, 1942, to Henry E. Rhea and Patent No. 2,299,944, issued October 27, 1942, to Karl R. Wendt. The output of the rectifier 36 is applied with one polarity to the amplifier 27 and with the opposite polarity to the amplifier 28, a polarity or phase inverting direct-current amplifier being provided at 38. The pulser 33 which modulates the output of the oscillator 34 also controls the activity of the gain equalization circuit by effecting a change in bias of the grid of the gate 35. The cycle of the pulser is related to the transmission pulse of the transmitter 20 as illustrated in Figure 5 so that the gain equalization operation is accomplished without interfering with the normal operation of the receiver.

Figure 4 shows merely by way of example one suitable circuit for the amplitude comparison circuit 31. It comprises a pair of amplifier tubes 61 and 62 that have their outputs taken off the cathode and anode, respectively. The resulting outputs of opposite polarity are supplied through blocking capicitors 60 and 65 and through resistors 63 and 64 to a resistor 66 where they are combined. If the pulses X and Y from the amplifiers 29 and 30, respectively, are of equal amplitude there is zero voltage at the output end of resistor 66. If pulse X or pulse Y is of greater amplitude than the other, then the voltage at said output end will be either plus or minus depending upon which pulse is greater.

Figure 6 shows a gain equalization circuit that may be employed in place of that shown in Figure 3. Instead of employing a phase inverter as in Figure 3, two keyed rectifiers 71 and 72 are provided which are arranged to supply outputs of opposite polarity. Outputs of opposite polarities may readily be obtained as, for example, connecting the diodes of rectifiers 71 and 72 in opposite directions.

It will appear from the foregoing description that immediately preceding the broadcast of the radio-frequency pulse of short duration by the transmitter 20, the pulser 33 will cause the pulsed oscillator 34 to deliver a pulse at carrier frequency to the crystal mixers 25 and 26, where the pulse is mixed with the output of local oscillator 36 to produce as an output of the mixers, currents of a frequency approximately that which is obtained when the echo currents from the antennas are combined with those from the local oscillator. The intermediate frequency currents from the mixers are amplified in the separate amplifier channels and transmitted to the comparator 31. In the event that the gain of one of the amplifiers is greater than that of the other, a resolved signal is produced. The existence of this signal is an indication that the gains in amplifiers are not equal, and the character of this signal indicates which amplifier is operating at the higher gain and to what degree is the difference in gains. The signal passes into the gated equalization circuit 32, which has been opened by the pulser 33, and is resolved as a direct-current voltage at the outputs of the keyed rectifier 36 and of the phase inverter 38 (assuming the circuit of Figure 3 is employed) which voltage will be applied to the grids of the amplifiers 27 and 28 and thereby equalize the gain of the amplifiers. In the event the gain characteristics of the separate amplifiers are identical, no signal will be generated by the camparator 31 during the equalization keying pulse and hence no change will be effected by the operation of the gain equalization circuit.

Subsequent to the completion of the gain equalization operation, the reflected or echo pulses will be received at the comparator circuit 31 and the directional information will thus be derived from the amplitude comparisons of received pulse signals. The output of the comparator 31 is gated in a well known manner by the range tracking circuit 40 and the gate 41 and supplited to a visual indicator 42. The function of circuit 40 and gate 41 is to isolate the visual indicator 42 from the receiver except at intervals of time at which reflected echoes are received from the target by the antennas.

I claim as my invention:

1. A system for equalizing the gains in a pair of amplifiers connected respectively to a pair of pulsed radio energy sources through a pair of circuits each of which circuits includes a frequency mixer connected to said amplifiers comprising: means for impressing upon said respective mixers the pulsed energy from said sources and energy from a first local oscillator, means for impressing upon said respective mixers energy from the said first local oscillator and energy from a pulsed second local oscillator, the pulses from said second oscillator being timed to occur between the pulses of said sources, means for impressing the outputs of said mixers upon said amplifiers, means for comparing the amplitudes of the outputs of said amplifiers whereby a voltage is created in proportion to the difference in said amplitudes, and means for selectively impressing upon said amplifiers the said voltage during the pulsing of said second oscillator, whereby the gains of said amplifiers are equalized.

2. A system for equalizing the gains in a pair of amplifiers connected respectively to a pair of pulsed radio energy sources through a pair of circuits each of which circuits includes a frequency mixer connected to said amplifiers comprising: means for impressing upon said respective mixers the pulsed energy from said sources and energy from a first local oscillator, means for impressing upon said respective mixers energy from the said first local oscillator and energy from a pulsed second local oscillator, the pulses from said second oscillator being timed to occur between the pulses of said sources, the frequency of said second oscillator being substantially equal to the frequency of the said radio energy sources, means for impressing the outputs of said mixers upon said amplifiers, means for comparing the amplitudes of the outputs of said amplifiers whereby a voltage is created in proportion to the difference in said amplitudes, and means for selectively impressing upon said amplifiers the said voltage during the pulsing of said second oscillator, whereby the gains of said amplifiers are equalized.

3. In a system for pointing a pair of antennas at a target, the axes of said antennas being parallel to each other and spaced apart in a certain plane, means for projecting pulsed radio energy in the direction of the target, means for receiving the radio echoes from said target by the said antennas, means for transmitting the energy received by the first of said antennas directly to a first frequency mixer and through a 90° phase shifter to a second frequency mixer, means for transmitting the energy received from the second of said antennas directly to a second frequency mixer and through a 90° phase shifter to the said first frequency mixer, means for impressing upon said mixers current from a local oscillator, means for amplifying the outputs of said mixers in a first and a second amplifier respectively, means for comparing the amplitudes of the outputs of said amplifiers, whereby a voltage is created proportional to the differences in said ampiltudes, the voltage created by the said comparing being a measure of the error in the pointing of the axes of the said antennas toward the target, whereby said antennas may be pointed at said target by moving the said pair of antennas in said certain plane until the said difference in amplitude of said amplifier outputs is zero.

4. In a system for pointing a pair of antennas at a target, the axes of said antennas being parallel to each other and spaced apart in a certain plane, means for projecting pulsed radio energy in the direction of the target, means for receiving the radio echoes from said target by the said antennas, means for transmitting the energy received by the first of said antennas directly to a first frequency mixer and through a 90° phase shifter to a second frequency mixer, means for transmitting the energy received from the second of said antennas directly to a second frequency mixer and through a 90° phase shifter to the said first frequency mixer, means for impressing upon said mixers current from a local oscillator, means for amplifying the outputs of said mixers in a first and a second amplifier respectively, means for comparing the amplitudes of the outputs of said amplifiers, whereby a voltage is created proportional to the differences in said amplitudes, means for impressing upon said mixers a pulsed local oscillation current the frequency of which is substantially the same as said projected radio energy and the pulses of said pulsed local oscillation current being timed to occur between the pulses of said pulsed radio energy, means for selectively impressing upon said amplifiers the said voltage created by said comparing during the pulse periods of said pulsed local oscillator, means for impressing upon a voltage indicator the voltage created by said comparing during the periods said echoes are being received by said antennas, the response of said indicator being a measure of the error in the pointing of axes of the said antennas toward the target, whereby said antennas may be pointed at said target by moving said antennas in said certain plane until the said response of said voltage indicator is zero.

5. The invention set forth in claim 3 wherein means is provided for timing the pulses of said pulsed local oscillation current to occur between the pulses of said pulsed radio energy and the instants the said radio echoes are received by said antennas.

6. A device for determining the relative gain in a pair of amplifiers connected respectively to a pair of pulsed radio energy sources, an amplitude comparator to which the outputs of said amplifiers are applied, a gate connected to receive the output of said comparator, a third radio energy source, means including a pulser for impressing upon both of said amplifiers a pulsed current from said third source, the said pulses also substantially simultaneously pulsing said gate and the said pulses being so timed that said pulser pulses said third source and said gate between the pulses of said pair of sources, whereby the output of said gate is a measure of the relative gains of said amplifiers, the output of said gate being zero when the gains in said amplifiers are equal, and means for equalizing the gains of said amplifiers as a function of the output of said gate.

7. A device for determining the relative gain in a pair of amplifiers connected respectively to a pair of pulsed radio energy sources, an amplitude comparator to which the outputs of said amplifiers are applied, a gate connected to receive the output of said comparator, a third radio energy source, means including a pulser for impressing upon both of said amplifiers a pulsed current from said third source the frequency of which is approximately equal to the frequencies of said sources, the said pulses also simultaneously pulsing said gate and the said pulses being so timed that said pulser pulses said third source and said gate between the pulses of said pair of sources, whereby the output of said gate is a measure of the relative gains of said amplifiers, the output of said gate being zero when the gains in said amplifiers are equal, and means for equalizing the gains of said amplifiers as a function of the output of said gate.

8. A device for equalizing the gain in a pair of amplifiers connected respectively to a pair of frequency mixers fed by a pair of pulsed radio energy sources and an oscillator, comprising: an amplitude comparator connected to said amplifiers, a gate connected to said comparator, a second oscillator, a pulser connected to said second oscillator and said gate, the said pulser pulsing said second oscillator and said gate between the pulses of said radio energy sources, and a gain equalization circuit connected to said gate and to said amplifiers, whereby the output of said gate is selectively applied to one of said amplifiers.

9. The device defined in claim 8 characterized by the said gain equalization circuit including a keyed rectifier receiving the output from said gate, an inverter amplifier stage connected to receive a control voltage from said rectifier, one amplifier of said pair being connected to receive signal directly from said keyed rectifier to control the gain of said one amplifier, and the other amplifier of said pair being connected to receive signal from said inverter stage to control the gain of said other amplifier.

10. The device defined in claim 8 characterized by the said gain equalization circuit including a pair of keyed rectifiers receiving the output from said gate, said keyed rectifiers being arranged to have outputs of opposite polarity, one amplifier of said pair being connected to receive signal from one of said rectifiers to control the gain of said one amplifier and the other amplifier of said pair being connected to receive signal from the other of said rectifiers to control the gain of said other amplifier.

11. A device for equalizing the gain in a pair of amplifiers connected respectively to a pair of frequency mixers fed by a pair of pulsed radio energy sources and an oscillator, comprising: an amplitude comparator connected to said amplifiers, a gate connected to said comparator, a second oscillator adjusted to a frequency substantially equal to the frequency of said sources, a pulser connected to said second oscillator and said gate, the said pulser pulsing said second oscillator and said gate between the pulses of said radio energy sources, and a gain equalization circuit connected to said gate and to said amplifiers, whereby the output of said gate is selectively applied to one of said amplifiers.

12. A device for equalizing the gains in a pair of amplifiers connected respectively to a pair of pulsed radio energy sources and to an amplitude comparator, comprising: a gate connected to said comparator, means including a pulser for impressing upon both of said amplifiers a pulsed current from a third source, the said pulses also simultaneously pulsing said gate and the said pulser being so timed that it pulses said third source and said gate between the pulses of said pair of sources, a gain equalization circuit connected to said gate, the output of which is selectively impressed upon one of said amplifiers, whereby the gains of said amplifiers are equalized.

13. A device for pointing a first and a second movable pulsed-radar antenna at a target comprising: a local oscillator, a first and a second frequency mixer connected respectively to said oscillator and said antennas, a first 90° phase shifter connected between said first antenna and said second mixer, a second 90° phase shifter connected between said second antenna and said first mixer, a pair of amplifiers connected respectively to said mixers, an amplitude comparator connected to said amplifiers, the output of said comparator being an indication of the error of pointing said antennas at the said target, the said comparator output being zero when the antennas are moved to point directly at the said target.

14. A device for pointing a first and a second movable pulsed-radar antenna at a target comprising: a local oscillator, a first and a second frequency mixer connected respectively to said oscillator and said antennas, a first 90° phase shifter connected between said first antenna and said second mixer, a second 90° phase shifter connected between said second antenna and said first mixer, a pair of amplifiers connected respectively to said mixers, an amplitude comparator connected to said amplifiers, a visual indicator connected to said comparator, the said indicator reading zero when the antennas are pointed directly at the said target.

15. A device for pointing a first and a second movable pulsed-radar antenna at a target comprising: a local oscillator, a first and a second frequency mixer connected respectively to said oscillator and said antennas, a first 90° phase shifter connected between said first antenna and said second mixer, a second 90° phase shifter connected between said second antenna and said first mixer, a pair of amplifiers connected respectively to said mixers, an amplitude comparator connected to said amplifiers, a second oscillator connected to said mixers, a pulser connected to said second oscillator whereby the said second oscillator is pulsed between the pulses of said pulsed-radar antennas, a gate connected to said amplitude comparator and to said pulses, a gain equalization circuit connected to said gate and to said amplifiers, whereby the voltage created by said comparator is gated to said gain equalization circuit the output of which is selectively impressed upon the said amplifiers and the gains of said amplifiers are equalized.

16. A device for pointing a first and a second movable pulsed-radar antenna at a target comprising: a local oscillator, a first and a second frequency mixer connected respectively to said oscillator and said antennas, a first 90° phase shifter connected between said first antenna and said second mixer, a second 90° phase shifter connected between said second antenna and said first mixer, a pair of amplifiers connected respectively to said mixers, an amplitude comparator connected to said amplifiers, a second oscillator connected to said mixers, a pulser connected to said second oscillator whereby the said second oscillator is pulsed between the pulses of said pulsed-radar antennas, a first gate connected to said amplitude comparator and to said pulses, a gain equalization circuit connected to said first gate and to said amplifiers, a second gate connected to said amplitude comparator, a visual indicator connected to said gate, and means for pulsing said gate at periods of time that radar pulses are received by said antennas, whereby gains of said amplifiers are equalized between periods of time that pulses are received by said antennas and the said indicator determining when the said movable antennas are moved to point directly to said target.

17. The device defined in claim 16 characterized by the said gain equalization circuit including a keyed rectifier receiving the output from said first gate, an inverter amplifier stage connected to receive a control voltage from said rectifier, one amplifier of said pair being connected to receive signal directly from said keyed rectifier to control the gain of said one amplifier, and the other amplifier of said pair being connected to receive signal from said inverter stage to control the gain of said other amplifier.

18. The device defined in claim 16 characterized by the said gain equalization circuit including a pair of keyed rectifiers receiving the output from said first gate, said keyed rectifiers being arranged to have outputs of opposite polarity, one amplifier of said pair being connected to receive signal from one of said rectifiers to control the gain of said one amplifier, and the other amplifier of said pair being connected to receive signal from the other of said rectifiers to control the gain of said other amplifier.

19. A pulse modulated radio frequency signal receiver comprising: two separate antennas, two separate frequency mixers, a separate set of receiver feed lines directly connecting said separate antennas to said mixers, a second set of separate receiver feed lines including in each line a 90° phase shifter connecting said separate antennas to the frequency mixer that is directly connected to the other antenna of the said antennas, first oscillator connected to each of said frequency mixers, separate IF amplifiers connected respectively to said mixers, an amplitude comparator connected to both of said amplifiers, a first gate connected to said comparator, an equalization circuit connected to said first gate the output of said equalization circuit being selectively connected to said amplifiers, a second oscillator connected to said mixers and a pulser connected to said second oscillator and said first gate, the said pulser pulsing said oscillator between the times of reception of pulsed signals by said antennas, a second gate connected to said comparator, a visual indicator connected to said second gate and a pulser connected to said second gate, the said second gate being pulsed at the time of reception of pulses by said antennas, whereby the said comparator is gated to said visual indicator at times of reception of pulsed signals by said antennas and is gated to said equalization circuit between said times of reception of pulsed signals by said antennas.

20. In combination a pair of amplifiers the gains of which are to be equalized and to the input ends of which electrical pulses are applied from a pair of electrical energy sources, respectively, means for impressing upon said amplifiers a common source of electrical energy pulsed between the pulses of said sources, means for comparing the amplitudes of the outputs of said amplifiers, and means for selectively impressing upon said amplifiers the voltage resulting from said comparing during the pulsing of said common source, whereby the gains of said amplifiers are equalized.

21. A pair of amplifiers for amplifying electrical signals which are impressed upon the input circuits of said amplifiers periodically, whereby there are intervals during which said signals are not impressed upon said input circuits, means for impressing a control voltage upon said amplifiers during each of said intervals to produce at the output circuit of each amplifier an amplified energy impulse, means for comparing the amplified impulse from one amplifier with the amplified impulse from the other amplifier to produce a difference energy pulse, means for storing said difference energy pulses to obtain a gain control voltage, means for controlling the gains of said amplifiers as a function of said gain control voltage so as to maintain the relative gains of said amplifiers substantially constant.

22. A pair of amplifiers for amplifying electrical signals which are impressed upon the input circuits of said amplifiers periodically, whereby there are intervals during which said signals are not impressed upon said input circuits, means for impressing a control voltage upon said amplifiers during each of said intervals to produce at the output circuit of each amplifier an amplified energy impulse, means for comparing the amplified impulse from one amplifier with the amplified impulse from the other amplifier to produce a difference energy pulse, means for storing said difference energy pulses to obtain a gain control voltage, means for applying said gain control voltage with one polarity to one of said amplifiers and with the opposite polarity to the other of said amplifiers whereby the gains of said amplifiers are equalized.

References Cited in the file of this patent

UNITED STATES PATENTS

| | | |
|---|---|---|
| 2,226,366 | Braden | Dec. 24, 1940 |
| 2,418,143 | Stodola | Apr. 1, 1947 |
| 2,464,258 | Prichard | Mar. 15, 1949 |

FOREIGN PATENTS

| | | |
|---|---|---|
| 528,061 | Great Britain | Oct. 22, 1940 |